United States Patent [19]
Tan et al.

[11] Patent Number: 6,136,642
[45] Date of Patent: Oct. 24, 2000

[54] METHOD OF MAKING A DYNAMIC RANDOM ACCESS MEMORY

[75] Inventors: Wayne Tan, Taipei; Kun-Chi Lin, Hsinchu, both of Taiwan

[73] Assignee: United Microelectronics Corp., Hsinchu, Taiwan

[21] Appl. No.: 09/220,146

[22] Filed: Dec. 23, 1998

[51] Int. Cl.[7] .............................................. H01L 21/8242
[52] U.S. Cl. .............................................................. 438/253
[58] Field of Search ............................ 438/253, 254–256, 438/234–252, 800, 257–267; 257/324

[56] References Cited

U.S. PATENT DOCUMENTS 5,600,166   2/1997   Clementi et al. ..................... 257/324

*Primary Examiner*—Charles Bowers
*Assistant Examiner*—Craig Thompson
*Attorney, Agent, or Firm*—Thomas, Kayden, Horstemeyer & Risley

[57] ABSTRACT

A method of fabricating a dynamic random access memory includes forming a dummy layer over the isolation layer, in which the dummy layer has a higher etching selectivity than oxide. A dielectric layer is applied to isolate the bit lines. Then, a passivation layer is formed over the entire structure and a node contact opening is formed thereon. A liner oxide layer is then formed in the node contact opening to isolate the bit lines and the electrode of the capacitor. The node contact opening has a larger misalignment tolerance.

22 Claims, 5 Drawing Sheets

METHOD OF MAKING A DYNAMIC RANDOM ACCESS MEMORY

BACKGROUND OF THE INVENTION

FIELD OF THE INVENTION

This invention relates in general to a method of fabricating a dynamic random access memory (DRAM), and more particularly to a method of fabricating a node contact for a DRAM device.

It is very difficult to design the node contact in the manufacturing process of sub-micron stacked DRAM, especially when trying to avoid the shorts between the electrodes and bit lines. A method of depositing a liner oxide layer accompanied with etching back technology is used in conventional procedures to improve this problem. However, this conventional method still has some limitations, for example, the size of the contact opening is limited so that it is smaller than the width of the bit line. Therefore, as the size of the device decreases, the manufacturing process becomes more and more difficult.

FIG. 1 shows a diagram of a conventional structure. Referring to FIG. 1, an inter-poly dielectric layer 102 is formed on a substrate 100. Polycide layers 104 acting bit lines are formed on the dielectric layer 102. Then, an oxide layer 106 for isolation is formed over the bit lines 104. A contact opening 108 is formed between the bit lines 104. Liner oxide layers 110 are utilized to isolate the bit lines 104 and polysilicon layer 112 which is an electrode of a capacitor. The drawback of the conventional process is that the width of the contact opening 108 has to be smaller than the distance between the bit lines 104. Otherwise, shorts will occur on the top and corner portions of the bit lines.

SUMMARY OF THE INVENTION

It is therefore an object of the present invention to a method of manufacturing an improved DRAM structure. The DRAM has a dummy layer formed above the bit lines. An etching step with a higher selectivity for oxide than for polysilicon is used in the present invention to prevent the bit lines from making contact with the electrode of the capacitor.

It is another object of the present invention to provide a method of manufacturing an improved DRAM structure, which uses the dummy layer above the bit lines to avoid exposure of the bitlines as the width of the contact opening is enlarged. Therefore, the manufacturing process is much easier than the conventional process.

It is yet another object of the present invention to provide a method of manufacturing an improved DRAM structure, which can be used to decrease the size of the device.

The invention achieves the above-identified objects by providing a method of manufacturing a DRAM device. The manufacturing method includes forming a dummy layer over the isolation layer, in which the dummy layer has a higher etching selectivity than oxide. A dielectric layer is applied to isolate the bit lines. Then, a passivation layer is formed over the entire structure and a node contact opening is formed thereon. A liner oxide layer is then formed in the node contact opening to isolate the bit lines and the electrode of the capacitor. The node contact opening has a larger misalignment tolerance.

BRIEF DESCRIPTION OF THE DRAWINGS

Other objects features and advantages of the invention will become apparent from the following detailed description of the preferred but non-limiting embodiments. The description is made with reference to the accompanying drawings in which.

DESCRIPTION OF THE PREFERRED EMBODIMENT

The present invention provides a method of making a node contact structure suitable for a DRAM. First, a dummy layer is formed on the polysilicon layer acting as bit lines. This dummy layer is, for example, a polysilicon layer, and has a high etching selectivity to oxide layer. A dielectric layer acting an isolation layer is formed between the bit lines and dummy layer. A passivation layer is then formed and defined to form a node contact opening. Thereafter, a liner oxide layer is deposited to avoid shorts between the bit line and the electrode of the capacitor formed within the contact opening. The width of the contact opening according to the present invention is not limited to a size smaller than the distance between the bit lines.

Figure 1:
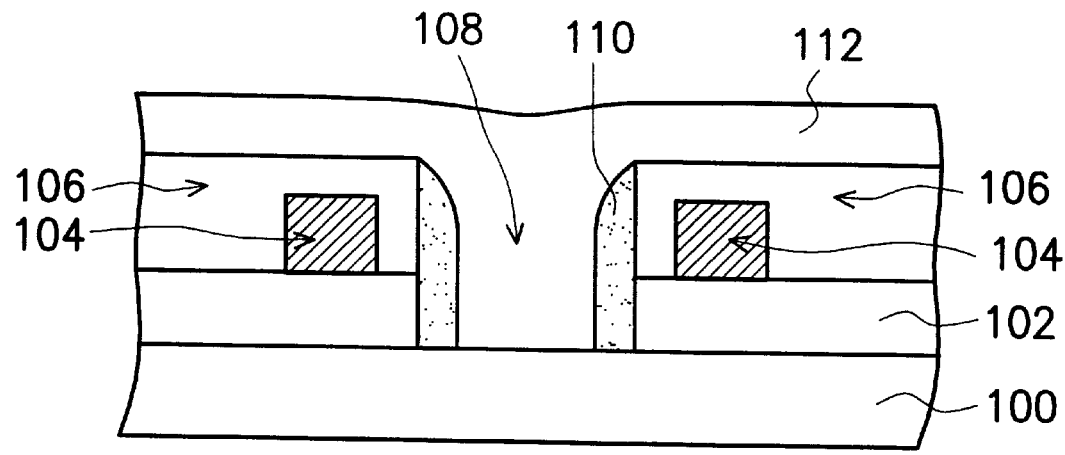
FIG. 1 (Prior Art) is a schematic, cross-sectional view showing a conventional DRAM structure.
Figure 2:
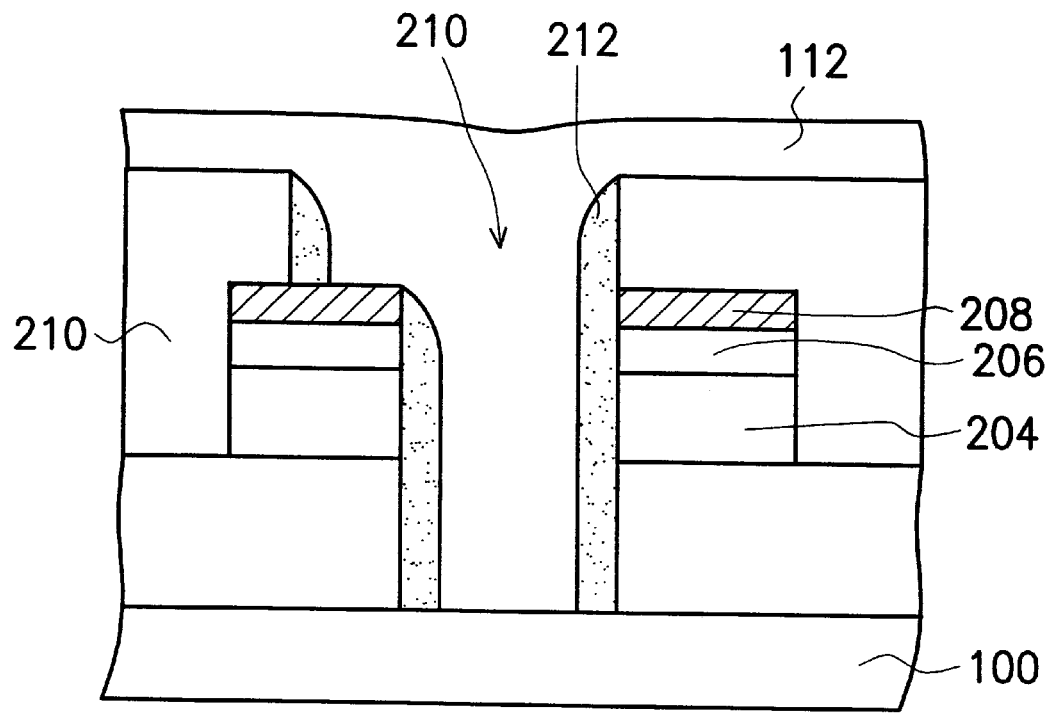
FIG. 2 is a schematic, cross-sectional view showing a DRAM structure in accordance to the preferred embodiment of the invention.

FIG. 2 is a schematic, cross-sectional view showing a DRAM structure in accordance with the preferred embodiment of the invention. Referring to FIG. 2, an inter-poly dielectric layer 202 is formed over the substrate 200. Polycide layer 204 acting as a bit line is formed on the inter-poly dielectric layer 202. A dummy layer 208 is formed over the polycide layer 204. An isolation layer 206 is formed between the polycide layer 204 and the dummy layer 208. The dummy layer 208, for example, a polysilicon layer, has a higher etching selectivity than oxide material. Therefore, the etching step to form the node contact opening has no effect on the dummy layer 208. The dummy layer 208 can be used to protect the bit line 204 during the etching step. Furthermore, the short current effect is avoided due to the isolation of the polycide layer 204 and the electrode of capacitor.

FIGS. 3A to 3K are schematic, cross-sectional views showing the process steps for manufacturing a DRAM structure according to the present invention.

Figure 3A:
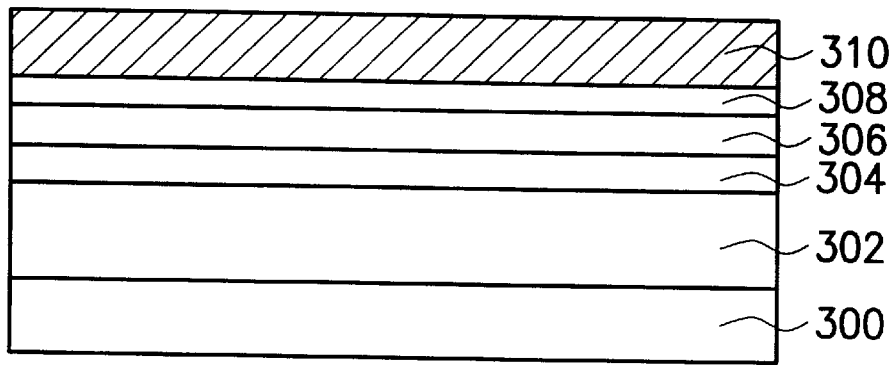
FIGS. 3A to 3K are schematic, cross-sectional views showing the process steps for manufacturing a DRAM structure according to the preferred embodiment of the invention.

Referring to FIG. 3A, a polysilicon layer 304 with a thickness of about 1000 Å and a tungsten silicide layer 306 with a thickness of about 1000 Å are formed sequentially over the inter-poly dielectric layer 302 formed on the substrate 300. A layer of isolation layer 308 with a thickness of about 500 Å is formed over the tungsten silicide layer 306. The isolation layer 308 is composed of, for example, a low-pressure tetraethoxysilane (LP-TEOS) and is applied for isolation. Thereafter, a chemical vapor deposition method is performed to form a dummy polysilicon layer 310 with a thickness of about 1000 Å over the isolation layer 308.

Figure 3B:
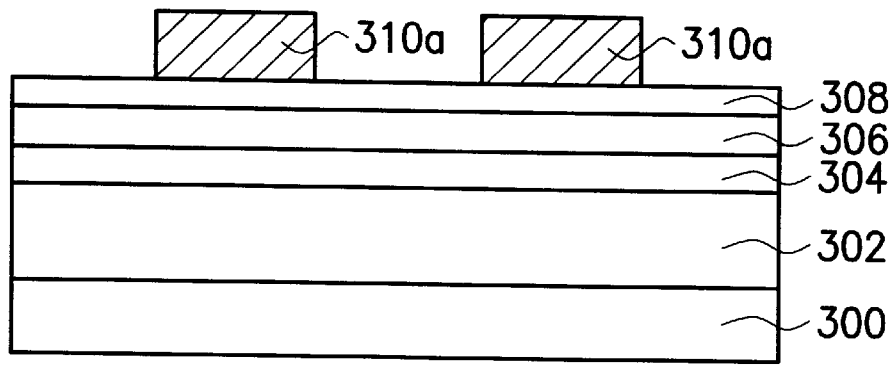

Referring to FIG. 3B, photolithography or a similar process is performed by using an additional mask to pattern the dummy polysilicon layer 310. An etching step is performed to form dummy polysilicon layers 310a to separate the dummy polysilicon layers 310a within the cell area and furthermore to remove the dummy polysilicon layers 310 (FIG. 3A) in the peripheral area. The etching step is stopped at the dielectric layer 308.

Figure 3C:
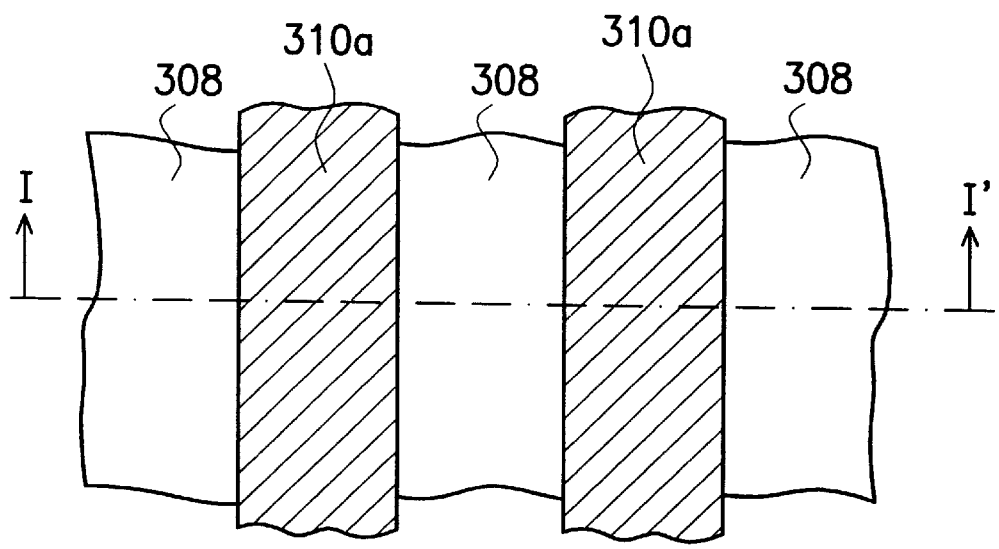

FIG. 3C is a top view of FIG. 3B. FIG. 3B is a schematic, cross-sectional view taken along the I–I' line of the FIG. 3C. FIG. 3C shows that the dummy polysilicon layer remains only in the cell area and the dummy polysilicon layer is removed completely from the peripheral areas.

Figure 3D:
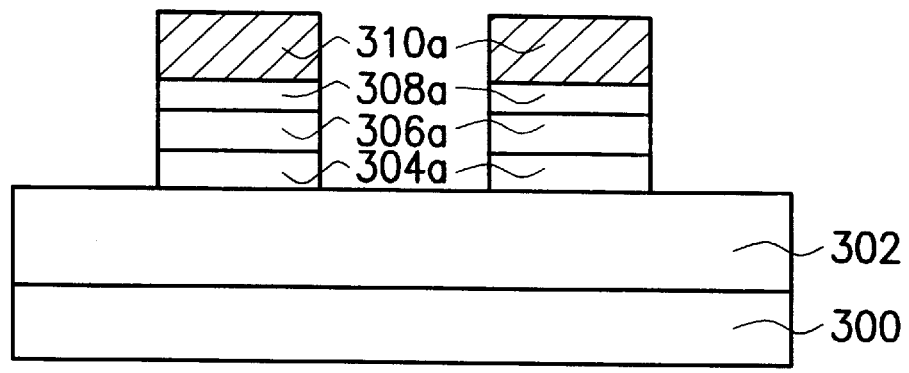
Figure 3E:
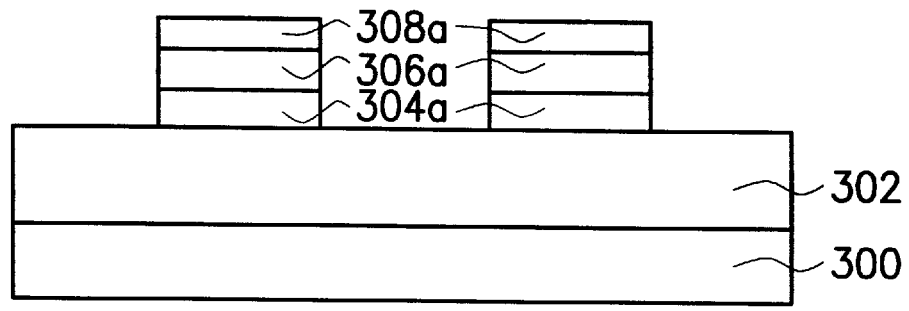

Referring to FIGS. 3D and 3E, a patterning step for a bit line is performed. An etching step is then performed to remove the dummy polysilicon layer 310a using an etchant that has a higher etching selectivity for polysilicon than for oxide, for example, a chlorine-based etchant. The etching is stopped at the isolation layer 308, and has no effect on the isolation layer 308. Thereafter, an etching step, using an etchant such as fluorocarbon with a high etching selectivity for oxide than for polysilicon, is performed to etch the isolation layer 308 to form the isolation layer 308a. Thereafter, etching steps are sequentially performed to etch the tungsten silicide layer 306 and polysilicon layer 304 until the inter-poly dielectric layer 302 is exposed to form the tungsten silicide layer 306a and polysilicon layer 304a.

Figure 3F:
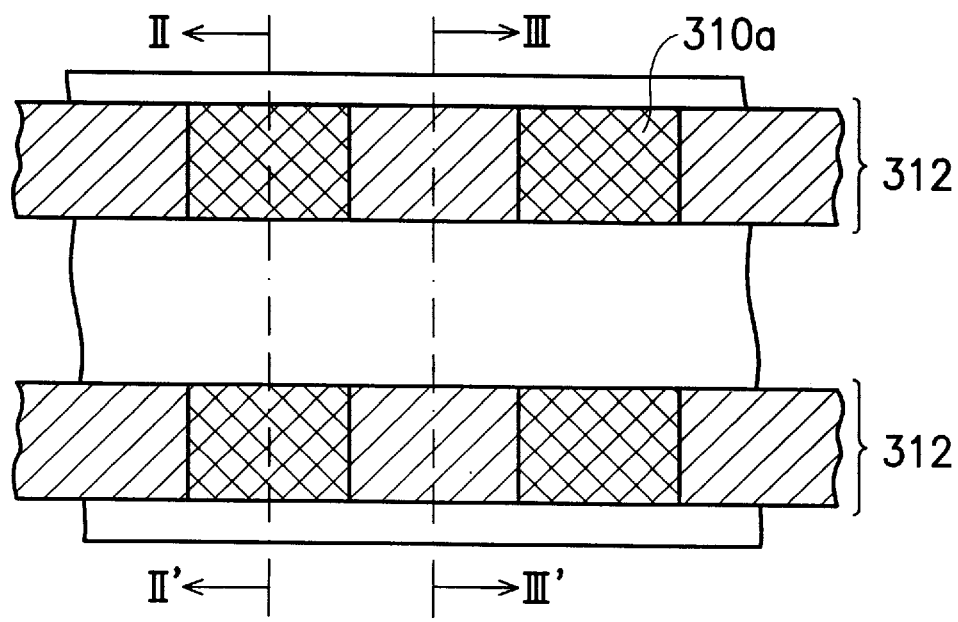

FIG. 3F is a top view of FIGS. 3D and 3E. FIG. 3F shows that the dummy polysilicon layer 310a only remains on the cross block. Numbers 312 represent the bit line. FIG. 3D is a schematic, cross-section view taken along the II–II' line of FIG. 3F. FIG. 3E is a schematic, cross-sectional view taken along the III–III' line of FIG. 3F.

Figure 3G:
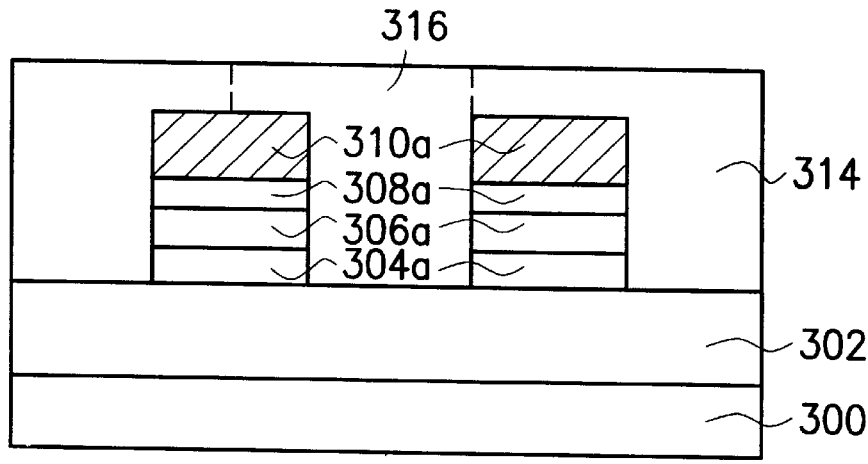

Referring to FIG. 3G, an isolation layer 314, for example, a BPSG layer, is formed over the whole structure by chemical vapor deposition. A node contact region 316 is then defined.

Figure 3H:
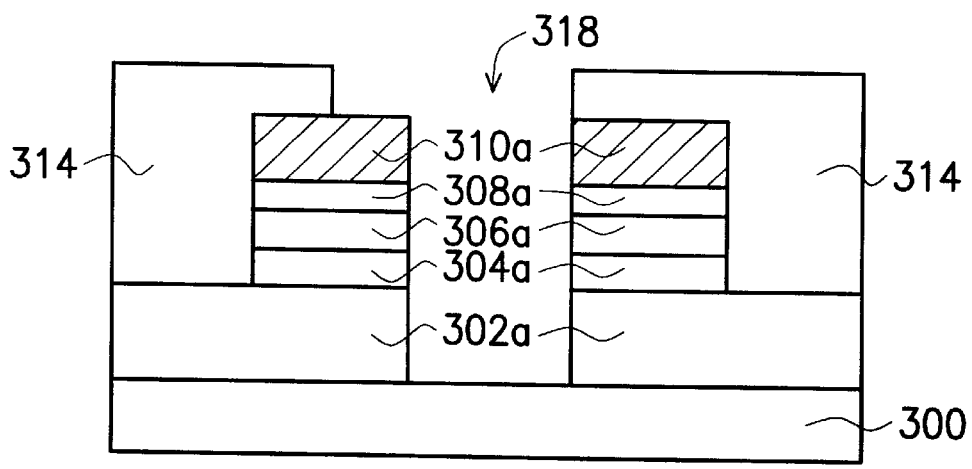

Referring to FIG. 3H, an etching step is performed to form a node contact opening 318 on the isolation layer 314, using an etchant such as fluorocarbon that has a higher etching selectivity for oxide than for polysilicon. Therefore, the etchant has no effect on polysilicon layer 310a.

Figure 3I:
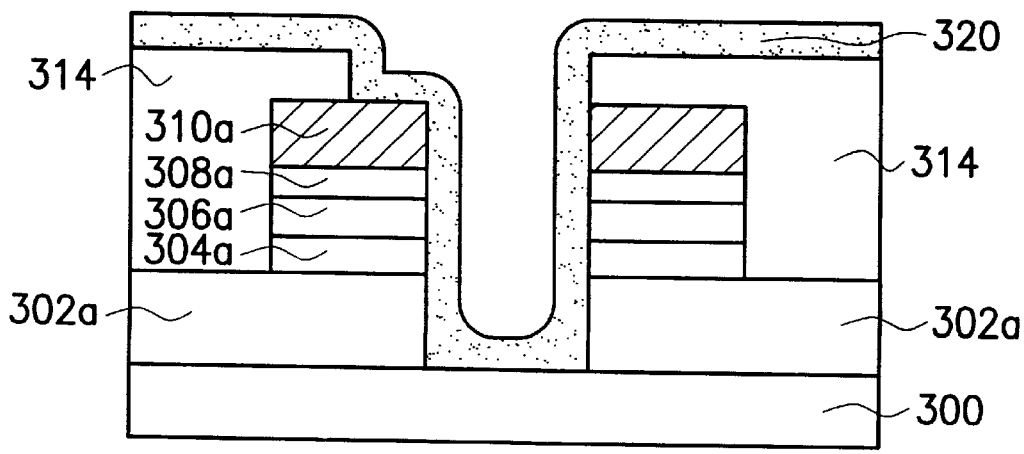

Referring to FIG. 3I, an oxide layer 320, for example, a low pressure-TEOS layer with a thickness of about 1000 Å is formed over the whole structure and covers the surface exposed within the node contact opening 318.

Figure 3J:
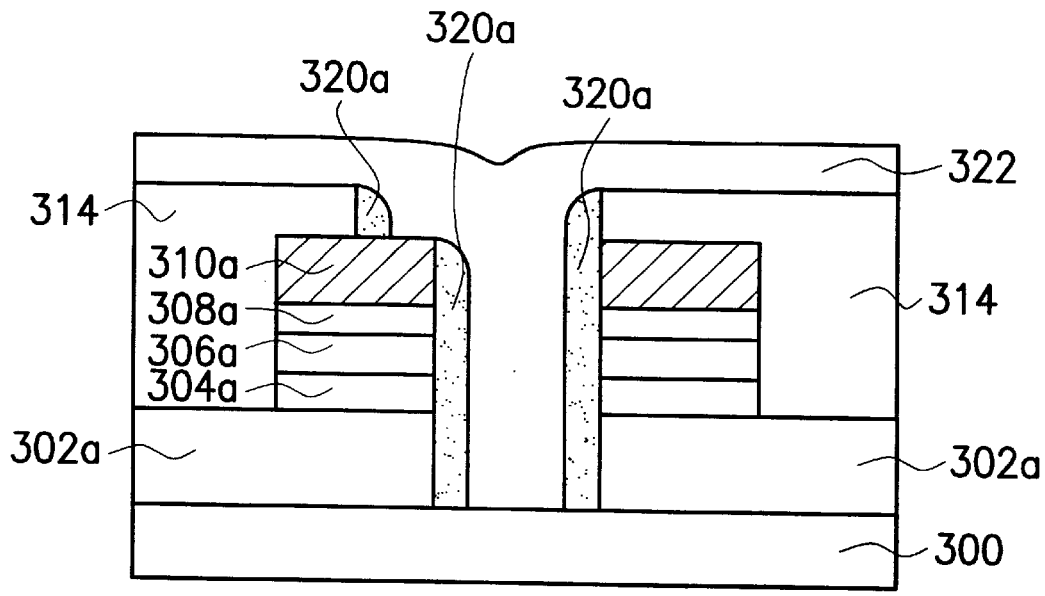

Referring to FIG. 3J, the oxide layer 320 is etched back to form a liner oxide layer 320a with a width of about 500 Å by performing an etching back step. The etching back step is performed by using an etchant such as fluorocarbon that has a higher etching selectivity for oxide than for polysilicon, so that the etchant has no effect on the dummy polysilicon layer 310a. A polysilicon layer 322 is then formed over the whole structure and fills the node contact opening 318. The polysilicon layer 322 serves as an electrode of a capacitor. As described above, the polysilicon layer 322 is in contact with the dummy polysilicon layer 310a, but not with the polysilicon layer 304 and the tungsten silicide layer 306, which are protected by the liner oxide layer 320a.

Figure 3K:
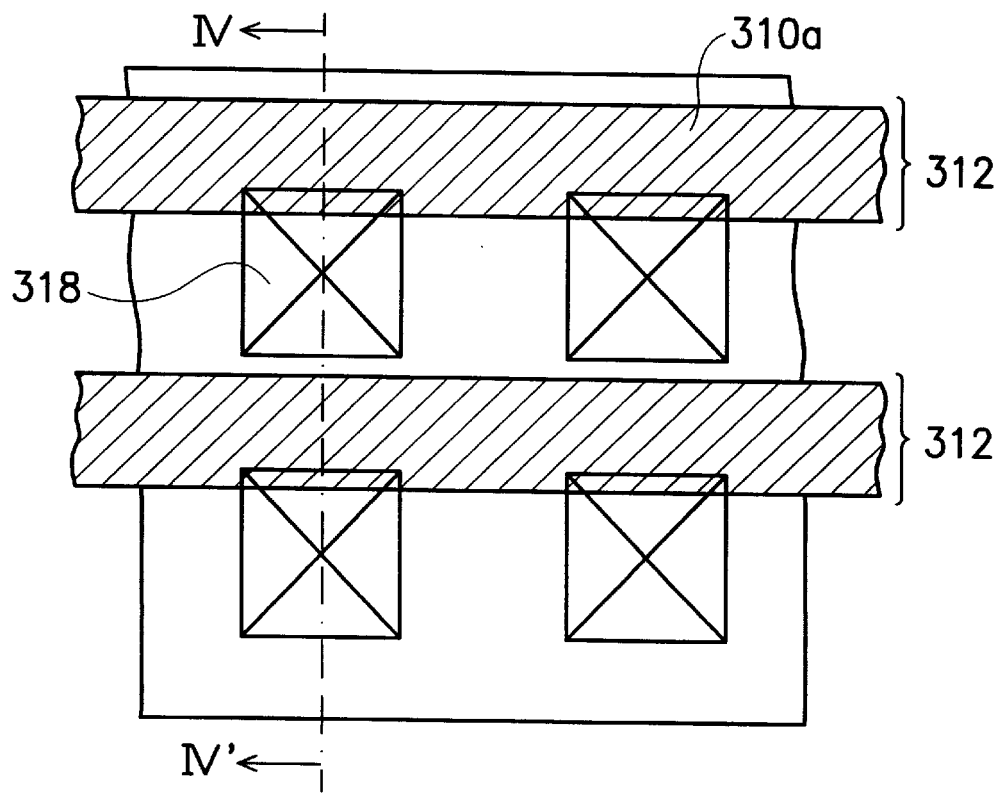

FIG. 3K is a top view of DRAM device according to the present invention. FIG. 3J is a cross-section view taken along the IV–IV' line of FIG. 3K.

One feature of the present invention is that a dummy layer is formed over the bit line by the use of an etchant with a higher etching selectivity for oxide than for polysilicon to prevent the bit line from making contact with the electrode of the capacitor.

Another feature of the present invention is that the node contact opening is prevented from exposing the bit line. The node contact opening according to the present invention has a larger misalignment tolerance.

While the invention has been described by way of example and in terms of the preferred embodiment, it is to be understood that the invention is not limited thereto. To the contrary, it is intended to cover various modifications and similar arrangements. The appended claims, therefore, should be accorded the broadest interpretation so as to encompass all such modifications and similar arrangements.

What is claimed is:

1. A method of fabricating a dynamic random access memory, suitable for forming a node contact opening between bit lines, wherein an inter-poly dielectric layer, a polycide layer, and an isolation layer are formed sequentially on a substrate, the method comprising the steps of:

forming a dummy layer over the isolation layer, wherein the dummy layer has a higher etching selectivity than oxide;

patterning and removing the dummy layer located over a cell area to expose the isolation layer;

etching a region not covered by the dummy layer until the inter-poly dielectric layer is exposed;

forming an insulation layer over the entire structure; and forming a node contact opening on the isolation layer and adjacent to the dummy layer.

2. The method of claim 1, wherein the dummy layer is a polysilicon layer.

3. The method of claim 2, wherein the dummy layer has a thickness of about 1000 Å.

4. The method of claim 1, wherein the polycide layer is composed of a polysilicon layer having a thickness of about 1000 Å and a tungsten silicide layer having a thickness of about 1000 Å.

5. The method of claim 1, wherein the isolation layer is a low-pressure TEOS layer.

6. The method of claim 1, wherein the isolation layer has a thickness of about 500 Å.

7. The method of claim 1, wherein the insulation layer is a BPSG layer.

8. The method of claim 1, wherein the insulation layer is formed by chemical vapor deposition.

9. The method of claim 1, wherein the node contact opening is formed by etching with an etchant having a higher etching selectivity for oxide than for polysilicon.

10. A method of fabricating a dynamic random access memory, suitable for forming a node contact opening between bit lines, wherein an inter-poly dielectric layer, a polycide layer and an isolation layer are formed sequentially on a substrate, the method comprising the steps of:

forming a dummy layer over the isolation layer, wherein the dummy layer has a higher etching selectivity than oxide;

patterning and removing the dummy layer located over a cell area to expose the isolation layer;

etching a region not covered by the dummy layer until the inter-poly dielectric layer is exposed;

forming an insulation layer over the entire structure;

forming a node contact opening on the insulation layer and adjacent to the dummy layer;

forming an oxide layer over the entire structure and filling the node contact opening; and etching the oxide layer to from a liner oxide layer covering the sidewalls of the node contact opening.

11. The method of claim 10, wherein the method further comprises the step of depositing a polysilicon layer over the entire structure and filling the node contact opening.

12. The method of claim 10, wherein the dummy layer is a polysilicon layer.

13. The method of claim 12, wherein the dummy layer has a thickness of about 1000 Å.

14. The method of claim 10, wherein the polycide layer is composed of a polysilicon layer having a thickness of about 1000 Å and a tungsten silicide layer having a thickness of about 1000 Å.

15. The method of claim 10, wherein the isolation layer is a low-pressure TEOS layer.

16. The method of claim 10, wherein the isolation layer has a thickness of about 500 Å.

17. The method of claim 10, wherein the insulation layer is a BPSG layer.

18. The method of claim 10, wherein the insulation layer is formed by chemical vapor deposition.

19. The method of claim 10, wherein the node contact opening is formed by etching with an etchant having a higher etching selectivity for oxide than for polysilicon.

20. The method of claim 10, wherein the oxide layer is a low-pressure TEOS layer.

21. The method of claim 10, wherein the liner oxide layer is formed by etching back.

22. The method of claim 21, wherein the linear oxide layer has a thickness of about 500 Å.

* * * * *